United States Patent
Hwang et al.

(10) Patent No.: US 7,821,139 B2
(45) Date of Patent: Oct. 26, 2010

(54) FLIP-CHIP ASSEMBLY AND METHOD OF MANUFACTURING THE SAME

(75) Inventors: Tae-Joo Hwang, Gyeonggi-do (KR);
Eun-Chul Ahn, Gyeonggi-do (KR);
Tae-Gyeong Chung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 123 days.

(21) Appl. No.: 11/946,750

(22) Filed: Nov. 28, 2007

(65) Prior Publication Data
US 2008/0122084 A1 May 29, 2008

(30) Foreign Application Priority Data
Nov. 29, 2006 (KR) .................. 10-2006-0118709

(51) Int. Cl.
*H01L 31/00* (2006.01)
(52) U.S. Cl. .......... 257/778; 257/E23.01; 257/E21.505; 438/108; 438/115
(58) Field of Classification Search .......... 438/108, 438/115; 257/778, E23.01, E21.505
See application file for complete search history.

(56) References Cited

U.S. PATENT DOCUMENTS

| | | | |
|---|---|---|---|
| 6,190,940 B1 * | 2/2001 | DeFelice et al. ............. 438/106 |
| 6,566,612 B2 * | 5/2003 | Brouillette et al. .......... 174/263 |
| 6,927,490 B2 * | 8/2005 | Franzon et al. ............. 257/734 |
| 6,940,161 B2 * | 9/2005 | Kawanobe et al. .......... 257/702 |
| 2003/0100200 A1 * | 5/2003 | Franzon et al. .............. 439/66 |
| 2005/0046037 A1 * | 3/2005 | Franzon et al. ............. 257/777 |
| 2005/0157244 A1 * | 7/2005 | Hwang et al. ............... 349/151 |
| 2005/0224969 A1 * | 10/2005 | Wu ............................. 257/737 |
| 2006/0087045 A1 * | 4/2006 | Yamano et al. ............. 257/787 |
| 2008/0284012 A1 * | 11/2008 | Okayama et al. ............ 257/737 |

FOREIGN PATENT DOCUMENTS

| | | |
|---|---|---|
| JP | 2000-150576 | 5/2000 |
| JP | 2003-224454 | 8/2003 |
| KR | 2005-84487 | 8/2005 |
| KR | 2006-0041453 | 5/2006 |

OTHER PUBLICATIONS

English language abstract of Japanese Publication No. 2000-150576.
English language abstract of Japanese Publication No. 2003-224454.
English language abstract of Korean Publication No. 2005-84487.
English language abstract of Korean Publication No. 2006-0041453.

* cited by examiner

*Primary Examiner*—Fernando L Toledo
(74) *Attorney, Agent, or Firm*—Mills & Onello, LLP

(57) ABSTRACT

A flip-chip assembly comprises a semiconductor chip, a substrate, a first buffer layer, a second buffer layer and a conductive bump. The semiconductor chip includes a first region and a second region adjacent to the first region. The substrate is disposed under the semiconductor chip. The first buffer layer is disposed between the first region of the semiconductor chip and the substrate. The second buffer layer is disposed between the second region of the semiconductor chip and the substrate. The conductive bump is formed through the second buffer layer and electrically connects the semiconductor chip to the substrate.

8 Claims, 3 Drawing Sheets

FLIP-CHIP ASSEMBLY AND METHOD OF MANUFACTURING THE SAME

CROSS-REFERENCE TO RELATED APPLICATIONS

This application claims priority under 35 U.S.C. §119 to Korean Patent Application No. 2006-118709, filed on Nov. 29, 2006 in the Korean Intellectual Property Office (KIPO), the contents of which are incorporated herein by reference in their entirety.

BACKGROUND

1. Technical Field

Example embodiments of the present invention relate to a flip-chip assembly and a method of manufacturing the flip-chip assembly. More particularly, example embodiments of the present invention relate to a flip-chip assembly that is obtained by electrically combining a semiconductor chip and a substrate with each other, and a method of manufacturing the flip-chip assembly.

2. Description of the Related Art

According to conventional methods, a wire bonding process using conductive metal wire is usually used as part of a method of packaging a semiconductor device. However, as the degree of integration of semiconductor devices increases, and electronic devices using the semiconductor devices become highly efficient, the wire bonding method may not be able to keep up with improvements of the semiconductor devices. One of the packaging methods that may keep pace with the improvements of the semiconductor devices is a flip-chip bonding method.

In a flip-chip bonding method, after a semiconductor chip is mounted on a printed circuit board (PCB) using a conductive bump, a buffer material fills a space between the semiconductor chip and the PCB. When the buffer material has a high modulus, the conductive bump may be protected from stresses caused by external forces or temperature changes, but the buffer material having a high modulus delivers the stresses caused by the external forces or the temperature changes to the semiconductor chip. This may generate cracks in the semiconductor chip or damage a layer of the semiconductor chip. When a buffer material has a low modulus, the buffer material having a low modulus may absorb the stresses caused by external forces or temperature changes to protect the semiconductor chip, but the conductive bump may be broken or cracked by the stresses due to the external forces or the temperature changes. The present invention addresses these and other disadvantages of the conventional art.

SUMMARY

Example embodiments of the present invention provide a flip-chip assembly capable of protecting a semiconductor chip and a conductive bump. Example embodiments of the present invention also provide a method of manufacturing a flip-chip assembly capable of protecting a semiconductor chip and a conductive bump.

According to one aspect of the present invention, a flip-chip assembly comprises a semiconductor chip, a substrate, a first buffer layer, a second buffer layer and a conductive bump. The semiconductor chip includes a first region and a second region adjacent to the first region. The substrate is disposed under the semiconductor chip. The first buffer layer is disposed between the first region of the semiconductor chip and the substrate. The second buffer layer is disposed between the second region of the semiconductor chip and the substrate. The conductive bump is formed through the second buffer layer and electrically connects the semiconductor chip to the substrate.

According to some example embodiments of the present invention, a second buffer layer having a high modulus is formed adjacent to a conductive bump and a first buffer layer having a low modulus is formed at a portion where the first buffer layer is not formed. Thus, the conductive bump and the semiconductor chip may be protected to enhance the reliability of the flip-chip assembly.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION

Figure 1:
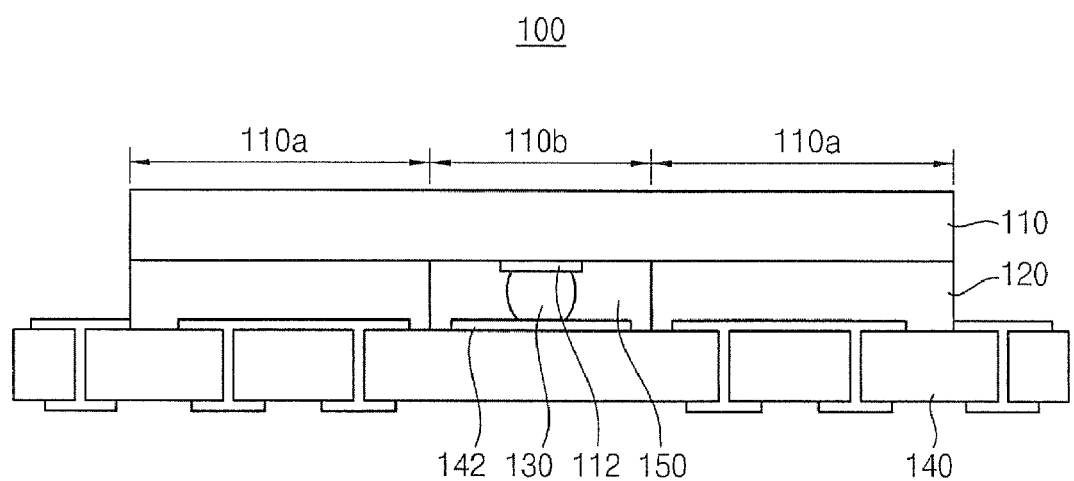
FIGS. 1 and 2 are cross-sectional views illustrating a flip-chip assembly in accordance with some example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, the present invention will be explained in detail with reference to the accompanying drawings.

FIG. 1 is a cross-sectional view illustrating a flip-chip assembly in accordance with some example embodiments of the present invention.

Referring FIG. 1, a flip-chip assembly 100 includes a semiconductor chip 110, a first buffer layer 120, a conductive bump 130, a substrate 140 and a second buffer layer 150.

The semiconductor chip 110 includes a first region 110a and a second region 110b. The first region 110a may be, for example, a cell region. The second region 110b may be, for example, a peripheral region. A plurality of chip pads 112 is formed on the second region 110b of a rear surface of the semiconductor chip 110.

The substrate 140 is formed under the semiconductor chip 110. The semiconductor chip 110 may be mounted on the substrate 140. A plurality of pads 142 is formed on the substrate 140. The pads 142 may correspond to the chip pads 112.

The conductive bump 130 may be a plurality of conductive bumps 130. The conductive bumps 130 electrically connect each of the chip pads 112 to each of the pads 142, respectively. The conductive bumps 130 are formed on the second region 110b. The second buffer layer 150 substantially surrounds the conductive bumps 130 between the pads 142 and the chip pads 112.

The first buffer layer 120 is formed on the first region 110a and fills a space between the semiconductor chip 110 and the substrate 140. The first buffer layer 120 covers a first region 110a of the semiconductor chip 110. The first buffer layer 120 may have first material properties. The first buffer layer 120 has, for example, a first modulus which is below about 1 GPa. The first buffer layer 120 may have a first glass transition temperature below about 120° C. The first buffer layer 120 may absorb stresses caused by external forces or temperature changes. Thus, generation of cracks in the semiconductor chip 110 caused by the stresses or the external forces, or damage to a dielectric layer included in the semiconductor chip 110 on the first region 110b may be minimized.

The second buffer layer 150 is formed on the second region 110b between the semiconductor chip 110 and the substrate 140. The second buffer layer 150 covers the conductive bump 130. The conductive bump 130 may be buried in the second buffer layer 150. That is, the second buffer layer 150 may bond the semiconductor chip 110 and the substrate 140 so that the conductive bump 130 is buried in the second buffer layer 150. The second buffer layer 150 may have second material properties that are different from the first material properties. The second buffer layer 150 has, for example, a second modulus which is above about 1 GPa. The second buffer layer 150 may have a second glass transition temperature above about 120° C. The second buffer layer 150 may support the conductive bump 130 to protect the conductive bump 130 from the stress caused by the external forces or the temperature changes. The second buffer layer 150 may reduce the chance of the conductive bump 130 being cracked and cut by the stress or the external forces.

The first and the second buffer layers 120 and 150 may independently include epoxy resin, thermoplastic material, thermosetting material, polyimide, polyurethane, polymeric material, etc. These may be used alone or in combinations thereof.

For example, the first buffer layer 120 and the second buffer layer 150 may include substantially the same material having different moduluses, respectively. For example, as the epoxy resin includes more silica content, the modulus of the epoxy becomes substantially higher. Thus, the first buffer layer 120 may include a first epoxy resin having first silica content. The second buffer layer 150 may include a second epoxy resin having second silica content, which is substantially higher than the first silica content. In a further example, the first and the second buffer layers 120 and 150 may independently include different materials having different moduluses, respectively.

According to exemplary embodiments of the present invention, the flip-chip assembly 100 includes a second buffer layer 150 and a first buffer layer 120. The second buffer layer 150 has a high modulus and is formed around the conductive bump 130. The first buffer layer 120 has a low modulus and is formed at a portion of the flip-chip assembly 100 where the second buffer layer 150 is not formed. Thus, double buffer layers, which include the first and second buffer layers 120 and 150, may protect the conductive bump 130 and a semiconductor chip 110 to enhance the reliability of the flip-chip assembly 100.

Figure 2:
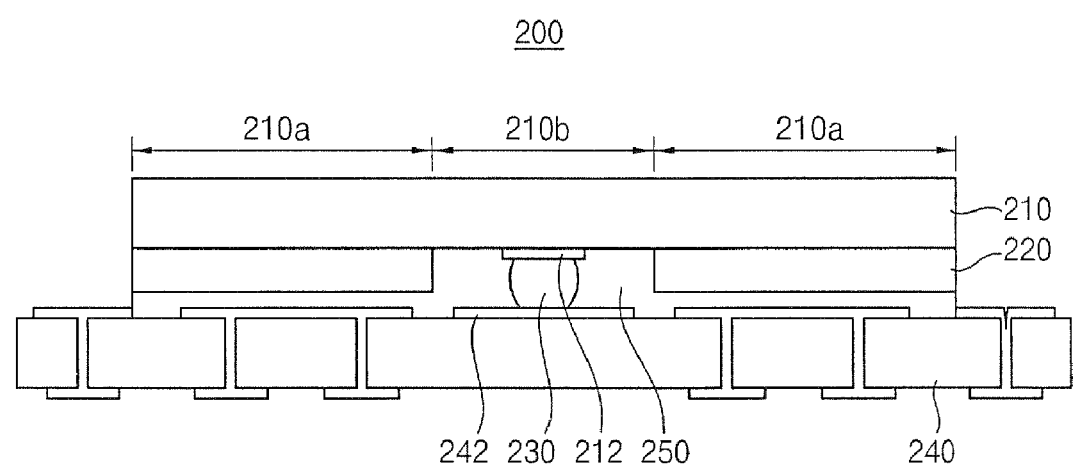

FIG. 2 is a cross-sectional view illustrating a flip-chip assembly in accordance with some example embodiments of the present invention.

Referring to FIG. 2, a flip-chip assembly 200 includes a semiconductor chip 210, a first buffer layer 220, a conductive bump 230, a substrate 240 and a second buffer layer 250.

The flip-chip assembly 200 is similar to or substantially the same as the flip-chip assembly 100 in FIG. 1 except that the second buffer layer 250 extends from a second region 210b to a first region 210a to fill a space between the first buffer layer 220 and the substrate 240.

The flip-chip assembly 200 includes double buffer layers, which are the first and second buffer layers 220 and 250, to protect the conductive bump 230 and a semiconductor chip 210, thereby enhancing the reliability of the flip-chip assembly 200. Additionally, the second buffer layer 250 extends from a second region 210b to a first region 210a to fill a space between the first buffer layer 220 and the substrate 240. The second buffer layer 250 may bond the first buffer layer 220 to the substrate 240. The second buffer layer 250 may bond the semiconductor chip 210 and the substrate 240 so that the conductive bump 230 is buried in the second buffer layer 250.

Figure 3:
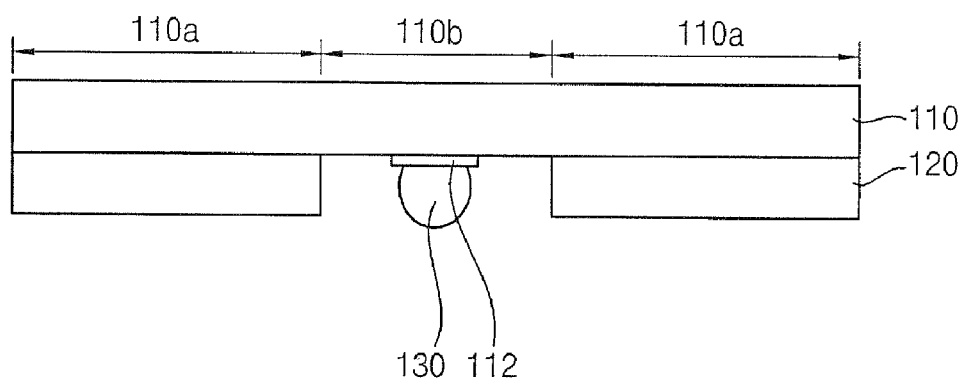
FIGS. 3 to 6 are cross-sectional views illustrating a method of manufacturing a flip-chip assembly in accordance with some example embodiments of the present invention.
Figure 4:
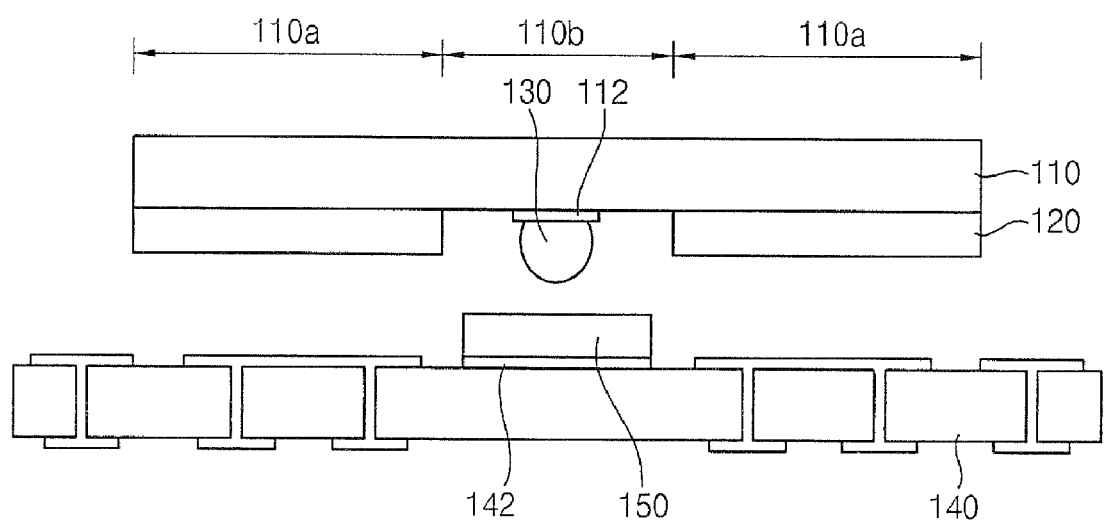
Figure 5:
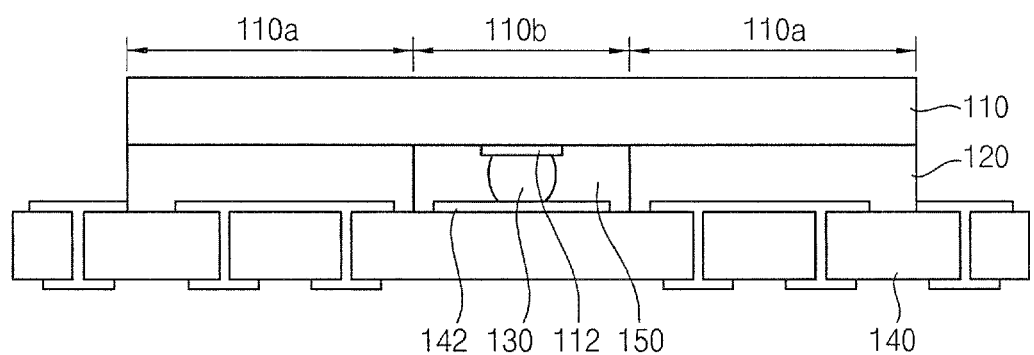

FIGS. 3 to 5 are cross-sectional views illustrating a method of manufacturing a flip-chip assembly in accordance with some example embodiments of the present invention.

Referring to FIG. 3, a semiconductor chip 110 including a first region 110a and a second region 110b is provided. The first region 110a may be a non-active region and the second region 110b may be an active region. A first buffer layer 120 is formed on a first region 110a. A conductive bump 130 electrically connected to a chip pad 112 is formed under the second region 110b. The first region 110a may be, for example, a cell region. The second region 110b may be, for example, a peripheral region.

In an example embodiment, the first buffer layer 120 may be formed on a first region 110a of a wafer (not illustrated) having repeated circuit patterns. The conductive bump 130 may be formed on the chip pad 112 of a second region 110b of the wafer. The semiconductor chip may be provided by cutting the wafer into individual semiconductor chips or dies.

In an example embodiment, a wafer including circuit patterns may be cut into individual semiconductor chips. The first buffer layer 120 may be formed on a first region 110a of the cut wafer. The conductive bump 130 may be formed on the chip pad 112 of a second region 110b of the semiconductor chip 110.

A first photoresist layer may be formed on the wafer or the semiconductor chip. The first photoresist layer is exposed to light and developed to form a first photoresist pattern exposing the first region 110a. A first buffer material fills a portion exposed by the first photoresist pattern. The first photoresist pattern is removed from the wafer or the semiconductor chip to form the first buffer layer 120. In an exemplary embodiment, a mask exposing the first region 110a is fixed on the wafer or the semiconductor chip. The first buffer material may fill a space on the first region 110a exposed by the mask to form the first buffer layer 120.

Meanwhile, a mask exposing a chip pad 112 of the second region 110b is fixed on the wafer or the semiconductor chip. A conductive material may fill a space on the chip pad 112 of the second region 110b exposed by the mask to form the conductive bump 130.

The first buffer layer 120 may have first material properties. The first buffer layer 120 has, for example, a first modulus which may be below about 1 GPa. The first buffer layer 120 may have a first glass transition temperature below about 120° C. The first buffer layer 120 may include epoxy resin, a thermoplastic material, a thermosetting material, a polyimide, polyurethane, a polymeric material, etc. These may be used alone or in combinations thereof. The first buffer layer 120 may absorb stresses caused by external forces or temperature changes.

Referring to FIG. 4, a second buffer layer 150 is formed on the substrate 140.

A second photoresist layer may be formed on the substrate 140. The second photoresist layer may be exposed to light and developed to form a second photoresist pattern exposing a portion which corresponds to the second region 110b of the semiconductor chip 110. A second buffer material may fill a portion exposed by the second photoresist pattern. The second photoresist pattern may be removed from the substrate 140 to form the second buffer layer 150. In an exemplary embodiment, a mask exposing the second region 110b is fixed on the substrate 140. The second buffer material may fill a space exposed by the mask to form the second buffer layer 150.

The second buffer layer 150 may have second material properties that are different from the first material properties. The second buffer layer 150 has, for example, a second modulus which may be above about 1 GPa. The second buffer layer 150 may have a second glass transition temperature which may be above about 120° C. The second buffer layer 150 may respectively include epoxy resin, a thermoplastic material, a thermosetting material, a polyimide, polyurethane, a polymeric material, etc. These may be used alone or in combinations thereof.

Referring to FIG. 5, the semiconductor chip 110 and the substrate 140 are pressed together to be bonded to each other so that the conductive bump 130 may be buried in the second buffer layer 150.

Specifically, a surface of the semiconductor chip 110 on which the first buffer layer 120 is disposed opposes to a surface of the substrate 140 on which the second buffer layer 150 is formed. The conductive bump 130 may be formed on the second buffer layer 150. The semiconductor chip 110 and the substrate 140 are pressed together to bond the substrate pad 142 and the conductive bump 130. The semiconductor chip 110 may be heated before pressing the semiconductor chip 110 and the substrate 140 or after pressing the semiconductor chip 110 and the substrate 140. In an exemplary embodiment, the semiconductor chip 110 and the substrate 140 may be pressed together while the semiconductor chip 110 is heated to bond the conductive bump 130 to the pad 142. The conductive bump 130 is electrically connected to the pad 142 through the second buffer layer 150. The second buffer layer 150 may bond the semiconductor chip 110 and the substrate 140 together so that the conductive bump 130 is buried in the second buffer layer 150. The semiconductor chip 110 and the substrate 140 are bonded with each other to form a flip-chip assembly. The second buffer layer 150 may be only formed on the second region 10b of the semiconductor chip 110.

The first buffer layer 120 may absorb stresses caused by external forces or temperature changes. Thus, the generation of cracks in the semiconductor chip 110 caused by the stresses or damage to a dielectric layer in the semiconductor chip 110 on the first region may be reduced. The second buffer layer 150 surrounding conductive bump 130 may protect the conductive bump 130 from the stresses caused by external forces or temperature changes. The second buffer layer 150 may reduce the occurrence of the conductive bump 130 being cracked and cut by the stresses or the external forces.

Figure 6:
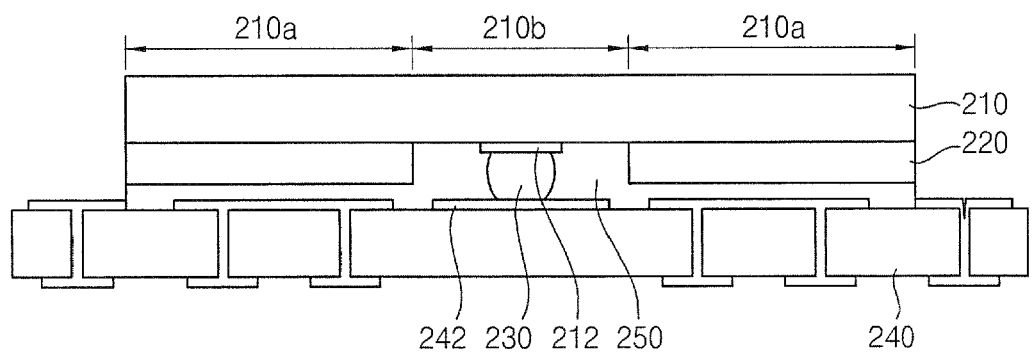

FIG. 6 is a cross-sectional view illustrating a method of manufacturing a flip-chip assembly in accordance with some example embodiments of the present invention.

Referring to FIG. 6, a method of manufacturing the flip-chip assembly is similar to or substantially the same as that in FIGS. 3 to 5 except that the second buffer layer 250 extends from a second region 210b to a first region 210a to fill a space between the first buffer layer 220 and the substrate 240 so that the semiconductor chip 210 and the substrate 240 are bonded with each other.

The first buffer layer 220 and the substrate 240 are strongly bonded with each other by the second buffer layer 250 since the second buffer layer 250 extends from a second region 210b to a first region 210a to fill a space between the first buffer layer 220 and the substrate 240.

According to some example embodiments of the present invention, a first buffer layer having a high modulus or a high glass transition temperature is formed at a portion where a conductive bump electrically connecting a semiconductor chip to a substrate is formed. A second buffer layer having a low modulus or a low glass transition temperature is formed at a portion where the first buffer layer is not formed. Thus, a flip-chip assembly including the first and second buffer layers may protect the semiconductor chip and the conductive bump from stresses caused by external forces or temperature changes to enhance the reliability of the flip-chip assembly.

According to one aspect of the present invention, a flip-chip assembly comprises a semiconductor chip, a substrate, a first buffer layer, a second buffer layer and a conductive bump. The semiconductor chip includes a first region and a second region adjacent to the first region. The substrate is disposed under the semiconductor chip. The first buffer layer is disposed between the first region of the semiconductor chip and the substrate. The second buffer layer is disposed between the second region of the semiconductor chip and the substrate. The conductive bump is formed through the second buffer layer and electrically connects the semiconductor chip to the substrate.

In an example embodiment, the second buffer layer may extend from the second region to the first region to fill a space between the first buffer layer and the substrate.

In an example embodiment, the first buffer layer may have a first modulus and the second buffer layer may have a second modulus substantially higher than the first modulus. The first modulus may be below about 1 GPa and the second modulus may be above about 1 GPa.

In an example embodiment, the first buffer layer may have a first glass transition temperature and the second buffer layer may have a second glass transition temperature substantially higher than the first glass transition temperature. The first glass transition temperature may be below about 120° C. and the second glass transition temperature may be above about 120° C.

In an example embodiment, the first and second buffer layers may include epoxy resin, a thermoplastic material, a thermosetting material, polyimide, polyurethane or a polymeric material, etc. These may be used alone and in combinations thereof.

In an example embodiment, the first region may be a cell region and the second region may be a peripheral region.

According to another aspect of the present invention, there is a method of manufacturing a flip-chip assembly. A semiconductor chip having a first region, a second region adjacent to the first region, a first buffer layer and a conductive bump is provided. The first buffer layer is formed on the first region and a conductive bump is formed on the second region. A second buffer layer is formed on a substrate. The substrate and the semiconductor chip are pressed to bond the substrate to the semiconductor chip so that the conductive bump may be buried in the second buffer layer.

In an example embodiment, the semiconductor chip may be provided as follows. The first buffer layer may be formed on a first region of a wafer having circuit patterns. The conductive bump may be formed on a second region of the wafer. The wafer may be cut into individual semiconductor chips.

In an example embodiment, the semiconductor chip may be provided as follows. A wafer having circuit patterns may be cut into individual semiconductor chips. The first buffer layer may be formed on a first region of the cut wafer. The conductive bump may be formed on a second region of the cut wafer.

In an example embodiment, the second buffer layer may bond the semiconductor chip to the substrate so that the second buffer layer may extend from the second region to the first region to fill a space between the first buffer layer and the substrate.

In an example embodiment, the first buffer layer may have a first modulus and the second buffer layer may have a second modulus substantially higher than the first modulus. The first modulus may be below about 1 GPa and the second modulus may be above about 1 GPa.

In an example embodiment, the first buffer layer may have a first glass transition temperature and the second buffer layer may have a second glass transition temperature substantially higher than the first glass transition temperature. The first glass transition temperature may be below about 120° C. and the second glass transition temperature may be above about 120° C.

In an example embodiment, the first and second buffer layers may include epoxy resin, a thermoplastic material, a thermosetting material, polyimide, polyurethane or a polymeric material, etc. These may be used alone and in combinations thereof.

In an example embodiment, the first region may be a cell region and the second region may be a peripheral region.

According to some example embodiments of the present invention, a second buffer layer having a high modulus is formed adjacent to a conductive bump and a first buffer layer having a low modulus is formed at a portion where the first buffer layer is not formed. Thus, the conductive bump and the semiconductor chip may be protected to enhance the reliability of the flip-chip assembly.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A flip-chip assembly comprising:
   a semiconductor chip including a first region and a second region adjacent to the first region;
   a substrate disposed under the semiconductor chip;
   a first buffer layer disposed between the first region of the semiconductor chip and the substrate;
   a second buffer layer disposed between the second region of the semiconductor chip and the substrate; and
   a conductive bump formed through the second buffer layer and electrically connecting the semiconductor chip to the substrate, wherein the second buffer layer completely encloses sidewalls of the conductive bump and directly contacts the semiconductor chip at the second region and the substrate.

2. The flip-chip assembly of claim 1, wherein the second buffer layer extends from the second region to the first region to fill a space between the first buffer layer and the substrate.

3. The flip-chip assembly of claim 1, wherein the first buffer layer has a first modulus and the second buffer layer has a second modulus substantially higher than the first modulus.

4. The flip-chip assembly of claim 3, wherein the first modulus is below about 1 GPa and the second modulus is above about 1 GPa.

5. The flip-chip assembly of claim 1, wherein the first buffer layer has a first glass transition temperature and the second buffer layer has a second glass transition temperature substantially higher than the first glass transition temperature.

6. The flip-chip assembly of claim 5, wherein the first glass transition temperature is below about 120° C. and the second glass transition temperature is above about 120° C.

7. The flip-chip assembly of claim 1, wherein the first and second buffer layers each include at least one selected from the group consisting of epoxy resin, a thermoplastic material, a thermosetting material, polyimide, polyurethane and a polymeric material.

8. The flip-chip assembly of claim 1, wherein the first region is a cell region and the second region is a peripheral region.

* * * * *